United States Patent
Xie et al.

(10) Patent No.: US 10,998,233 B2
(45) Date of Patent: May 4, 2021

(54) MECHANICALLY STABLE COMPLEMENTARY FIELD EFFECT TRANSISTORS

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Chun-Chen Yeh, Danbury, CT (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 16/292,801

(22) Filed: Mar. 5, 2019

(65) Prior Publication Data
US 2020/0286788 A1    Sep. 10, 2020

(51) Int. Cl.
| | |
|---|---|
| H01L 21/70 | (2006.01) |
| H01L 21/8238 | (2006.01) |
| H01L 21/822 | (2006.01) |
| H01L 21/306 | (2006.01) |
| H01L 29/66 | (2006.01) |

(Continued)

(52) U.S. Cl.
CPC .... *H01L 21/8221* (2013.01); *H01L 21/02532* (2013.01); *H01L 21/30604* (2013.01); *H01L 21/31053* (2013.01); *H01L 21/823807* (2013.01); *H01L 21/823821* (2013.01); *H01L 21/823842* (2013.01); *H01L 21/823878* (2013.01); *H01L 27/0924* (2013.01); *H01L 29/0653* (2013.01); *H01L 29/0673* (2013.01); *H01L 29/42392* (2013.01);

(Continued)

(58) Field of Classification Search
CPC ........... H01L 21/8221; H01L 21/02532; H01L 21/30604; H01L 21/31053; H01L 21/823807; H01L 21/823821; H01L 21/823; H01L 21/842; H01L 21/823878; H01L 27/0924; H01L 29/0653; H01L 29/0673; H01L 29/42392; H01L 29/66545; H01L 29/66553; H01L 29/6656; H01L 29/0847; H01L 21/823431; H01L 27/0886
See application file for complete search history.

(56) References Cited

U.S. PATENT DOCUMENTS

| | | |
|---|---|---|
| 7,683,428 B2 | 3/2010 | Chidambarrao et al. |
| 9,177,890 B2 | 11/2015 | Du |

(Continued)

*Primary Examiner* — Alonzo Chambliss
(74) *Attorney, Agent, or Firm* — Tutunjian & Bitetto, P.C.; L. Jeffrey Kelly

(57) ABSTRACT

A method is presented for constructing mechanically stable fins. The method includes forming a fin stack including a plurality of sacrificial layers, recessing the fin stack to form channel fins, depositing a first type epitaxy between the channel fins, depositing a dielectric region over the first type epitaxy, depositing a second type epitaxy over the dielectric region, and removing the plurality of sacrificial layers resulting in formation of a plurality of gaps. The method further includes filling a first set of the plurality of gaps with a p-type work function metal (WFM) to form a p-type field effect transistor (pFET) structure and filling a second set of the plurality of gaps with an n-type WFM to form an n-type field effect transistor (nFET) structure, where the nFET structure is stacked over the pFET structure.

19 Claims, 12 Drawing Sheets

(51) Int. Cl.
  *H01L 27/092* (2006.01)
  *H01L 21/3105* (2006.01)
  *H01L 29/06* (2006.01)
  *H01L 29/423* (2006.01)
  *H01L 21/02* (2006.01)
  *H01L 29/49* (2006.01)

(52) U.S. Cl.
  CPC .... *H01L 29/6656* (2013.01); *H01L 29/66545* (2013.01); *H01L 29/66553* (2013.01); *H01L 29/4966* (2013.01)

(56) References Cited

U.S. PATENT DOCUMENTS

| | | | |
|---|---|---|---|
| 9,202,894 B1 | 12/2015 | Zang | |
| 9,614,087 B1 | 4/2017 | Cheng et al. | |
| 9,659,963 B2 | 5/2017 | Cheng et al. | |
| 9,799,765 B1 | 10/2017 | Bergendahl et al. | |
| 10,056,254 B2 * | 8/2018 | Balakrishnan | H01L 21/02603 |
| 10,396,198 B2 * | 8/2019 | Balakrishnan | H01L 27/088 |
| 2006/0261406 A1 | 11/2006 | Chen | |
| 2011/0147812 A1 | 6/2011 | Steigerwald et al. | |
| 2011/0170266 A1 | 7/2011 | Haensch et al. | |
| 2013/0020707 A1 | 1/2013 | Or-Bach et al. | |
| 2013/0095580 A1 | 4/2013 | Or-Bach et al. | |
| 2013/0122672 A1 | 5/2013 | Or-Bach et al. | |
| 2014/0151639 A1 * | 6/2014 | Chang | H01L 27/1211 257/27 |
| 2015/0144880 A1 * | 5/2015 | Rachmady | H01L 29/045 257/24 |
| 2016/0043074 A1 | 2/2016 | Hurley et al. | |
| 2017/0025412 A1 | 1/2017 | Jun et al. | |
| 2018/0005834 A1 | 1/2018 | Cheng et al. | |
| 2019/0326286 A1 * | 10/2019 | Xie | H01L 29/0665 |
| 2020/0227305 A1 * | 7/2020 | Cheng | H01L 29/66439 |

* cited by examiner

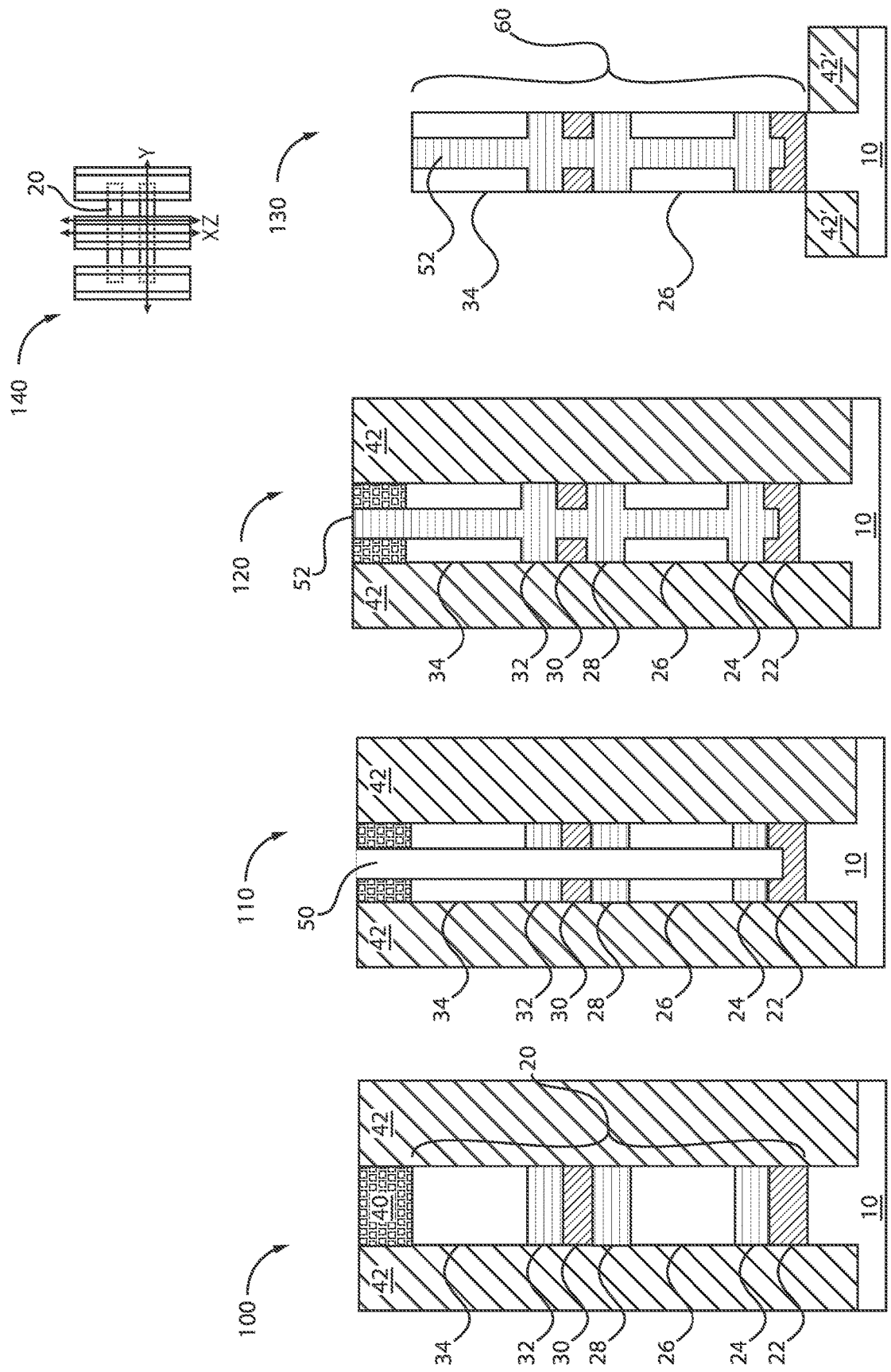

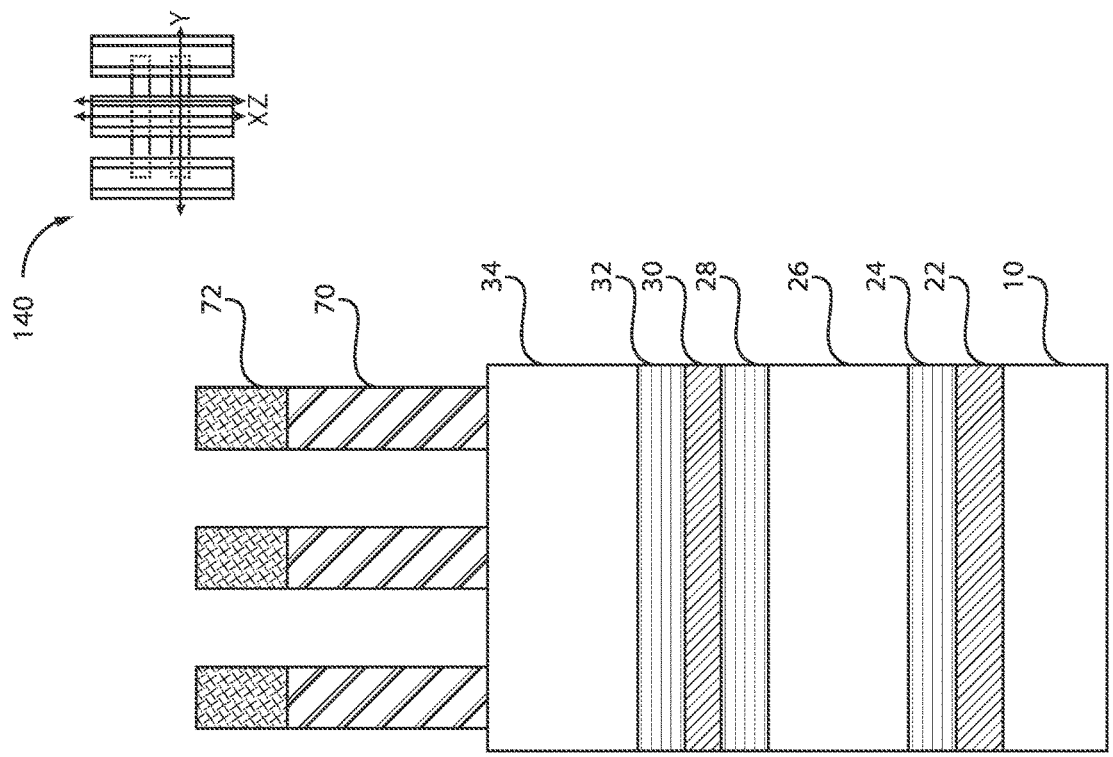
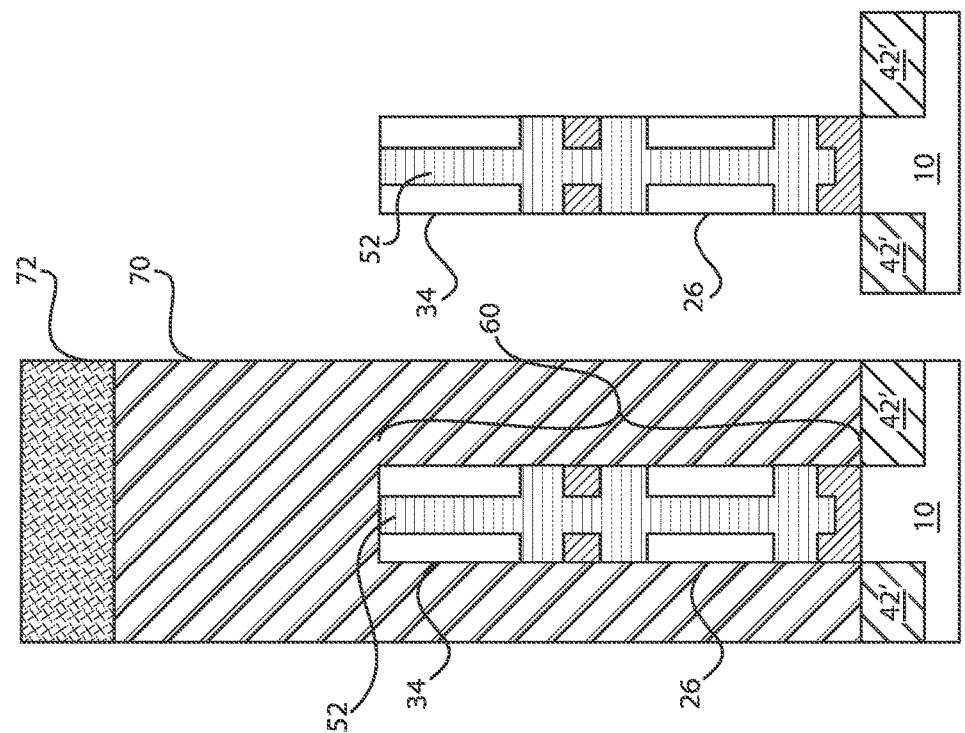
FIG. 5

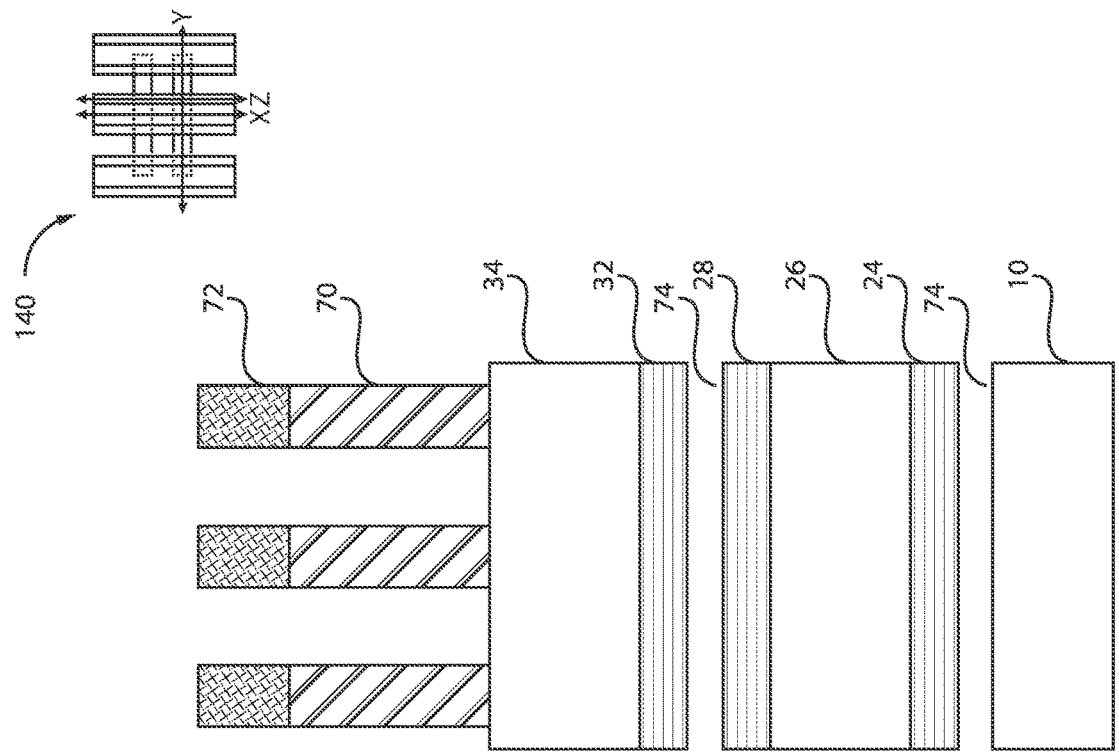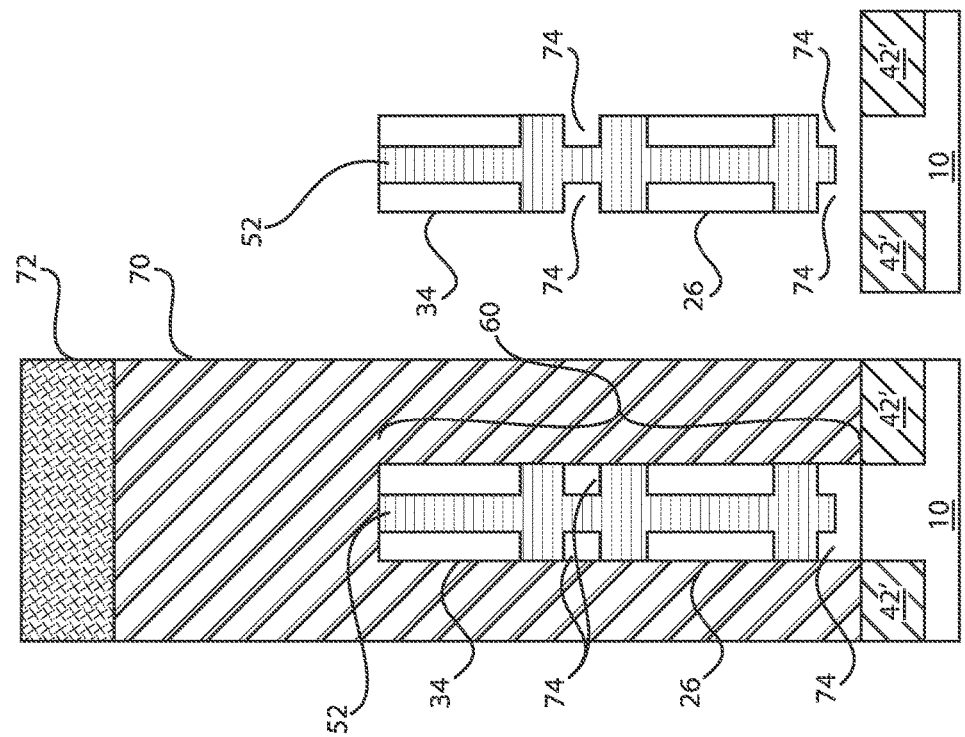
FIG. 6

MECHANICALLY STABLE COMPLEMENTARY FIELD EFFECT TRANSISTORS

BACKGROUND

The present invention relates generally to semiconductor devices, and more specifically, to forming a mechanically stable complementary field effect transistor (CFET) without fin collapse.

Slated for 2.5 nm and beyond, a CFET is a more complex version of a gate-all-around device. Traditional gate-all-around field effect transistors (FETs) stack several p-type wires on top of each other. In a separate device, the transistor stacks n-type wires on each other. In CFETs, the idea is to stack both n-type FET (nFET) and p-type FET (pFET) wires on each other. A CFET can stack one nFET on top of a pFET wire, or two nFETs on top of two pFET wires. Since a CFET stacks both n- and p-type devices on each other, the transistor provides benefits related to area.

SUMMARY

In accordance with an embodiment, a method is provided for constructing mechanically stable fins. The method includes forming a fin stack including a plurality of sacrificial layers, recessing the fin stack to form channel fins, depositing a first type epitaxy between the channel fins, depositing a dielectric region over the first type epitaxy, depositing a second type epitaxy over the dielectric region, removing the plurality of sacrificial layers resulting in formation of a plurality of gaps, filling a first set of the plurality of gaps with a p-type work function metal (WFM) to form a p-type field effect transistor (pFET) structure, and filling a second set of the plurality of gaps with an n-type WFM to form an n-type field effect transistor (nFET) structure, where the nFET structure is stacked over the pFET structure.

In accordance with another embodiment, a method is provided for constructing mechanically stable fins. The method includes forming a fin stack including a plurality of sacrificial layers, etching an opening within the fin stack to define inner spacers, filling the opening with a sacrificial material, depositing a dummy gate, selectively removing a first set of the plurality of sacrificial layers of the fin stack resulting in formation of a plurality of first gaps, and filling the plurality of first gaps with a spacer material. The method further includes recessing the fin stack to form channel fins, depositing a first type epitaxy between the channel fins, depositing a dielectric region over the first type epitaxy, depositing a second type epitaxy over the dielectric region, and removing the dummy gate and a second set of the plurality of sacrificial layers resulting in formation of a plurality of second gaps. The method also includes filling a first set of the plurality of second gaps with a first work function metal (WFM) and filling a second set of the plurality of second gaps with a second WFM.

In accordance with yet another embodiment, a semiconductor structure is provided for constructing mechanically stable fins. The semiconductor structure includes channel fins disposed over a substrate and an inner spacer constructed adjacent the channel fins, the inner spacer defining a vertical section extending from an upper portion to a lower portion of the channel fins, first and second horizontal sections defined at the upper portion of the channel fins, and a third horizontal section defined at the lower portion of the channel fins, wherein the first, second, and third horizontal sections extend through the vertical section.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein:

FIG. 1 is a cross-sectional view of a patterned fin stack, in accordance with an embodiment of the present invention;

FIG. 2 is a cross-sectional view of the fin stack of FIG. 1 where the hardmask is firstly removed selectively to the ILD to form a top opening, and after that, a conformal liner is deposited followed by anisotropic etch to form inner spacers, in accordance with an embodiment of the present invention;

FIG. 3 is a cross-sectional view of the fin stack of FIG. 2 where overfill and chemical-mechanical polishing (CMP) take place, in accordance with an embodiment of the present invention;

FIG. 4 is a cross-sectional view of the fin stack of FIG. 3 where etching reveals the fin structure, in accordance with an embodiment of the present invention;

FIG. 5 is a cross-sectional view of the fin stack of FIG. 4 where sacrificial gates are patterned, in accordance with an embodiment of the present invention;

FIG. 6 is a cross-sectional view of the fin stack of FIG. 5 where sacrificial layers are selectively removed, in accordance with an embodiment of the present invention;

Throughout the drawings, same or similar reference numerals represent the same or similar elements.

DETAILED DESCRIPTION

Figure 7:
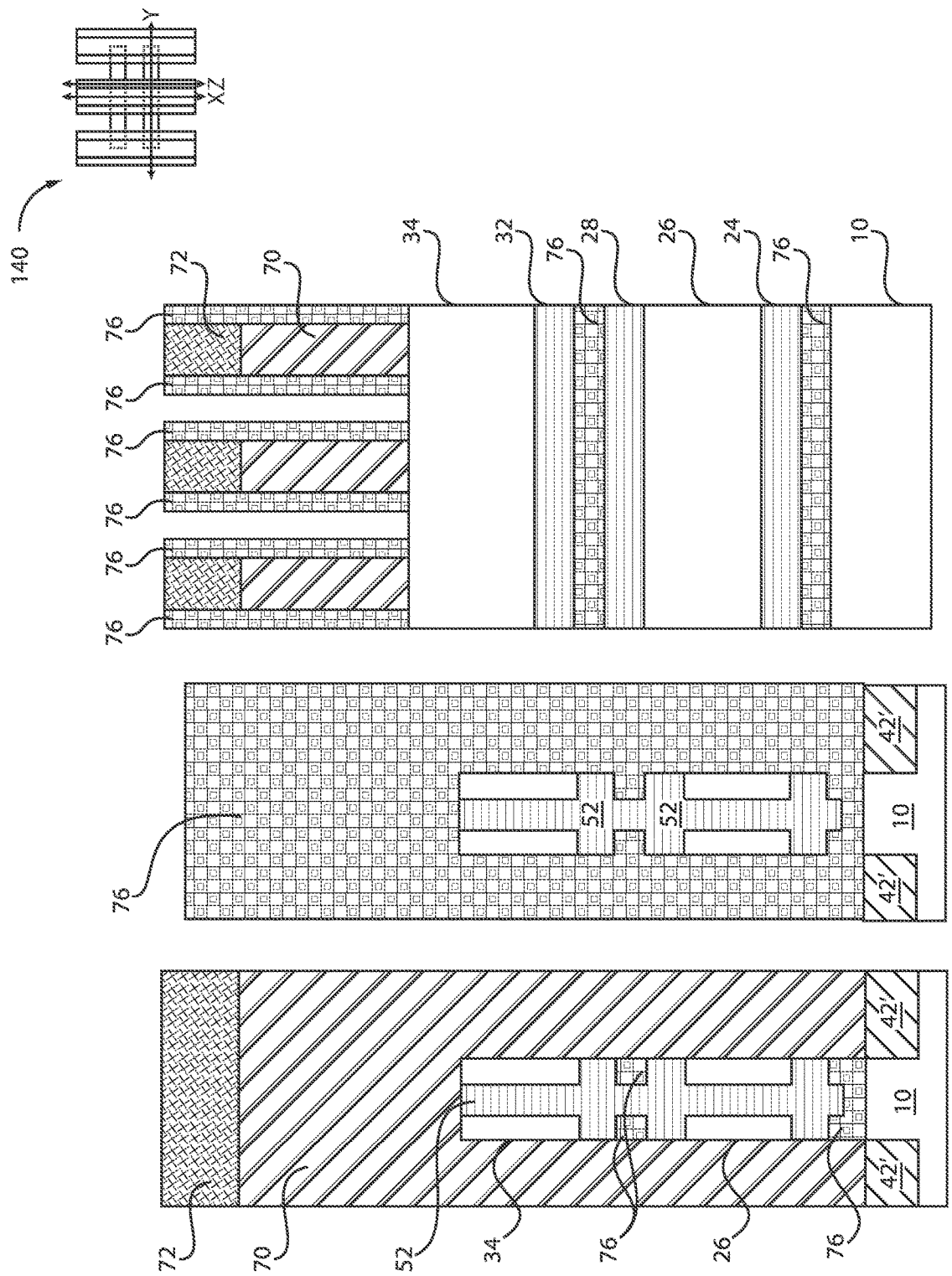
FIG. 7 is a cross-sectional view of the fin stack of FIG. 6 where spacers are formed, in accordance with an embodiment of the present invention.

Embodiments in accordance with the present invention provide methods and devices for forming a wide fin structure including channel fins and sacrificial material to reduce the aspect ratio and improve mechanical stability. During the replacement metal gate (RMG) process, the sacrificial material is removed and the wide fin is split into channel fins. The fin structure is a complementary field effect transistor (CFET). A CFET is a more complex gate-all-around technology, where the process stacks n-type field effect transistor (nFET) and p-type field effect transistor (pFET) wires on top of each other. The current gate-all-around devices stack one type of wire, whether it is nFET or pFET, on top of each other. In other words, the CFET is a further development of the stacked gate all around (GAA) nanowire form of transistor but one in which either n- or p-type GAAs are stacked above the other type so that two transistors occupy the space of one and complementary metal oxide semiconductor (CMOS) logic circuitry can be supported efficiently.

Embodiments in accordance with the present invention provide methods and devices for stacking transistors with different polarity. In particular, a method for preventing fin collapsing by forming a wide fin including multiple channel fins (each includes two fins vertically overlapped) and sacrificial materials is introduced. The sacrificial material is later removed during the RMG process. A stacked FinFET structure is thus created where PFETs (NFETs) are positioned directly on top of NFETs (PFETs). Each NFET (and each PFET) has a high-k dielectric and a work function metal (WFM) wrapped around the channel. A dielectric material is positioned in between NFET and PFET channels but does not directly contact the channels. Also, the NFET source/drain (S/D) and the PFET source/drain (S/D) are isolated from each other by dielectrics.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a patterned fin stack, in accordance with an embodiment of the present invention.

A semiconductor structure 100 includes a fin stack 20 formed over a substrate 10, the fin stack 20 including a first semiconductor layer 22, a second semiconductor layer 24, a third semiconductor layer 26, a fourth semiconductor layer 28, a fifth semiconductor layer 30, a sixth semiconductor layer 32, and a seventh semiconductor layer 34. A hardmask layer 40 is formed over the fin stack 20. An interlayer dielectric (ILD) 42 is formed over the fin stack 20 and planarized by, e.g., chemical-mechanical polishing (CMP).

The first semiconductor layer 22 and the fifth semiconductor layer 30 can be, e.g., silicon germanium (SiGe) layers. The SiGe layers 22, 30 have a germanium content of about 65%. The second semiconductor layer 24, the fourth semiconductor layer 28, and the sixth semiconductor layer 32 can be, e.g., SiGe layers. The SiGe layers 24, 28, 32 have a germanium content of about 35%. The third semiconductor layer 26 and the seventh semiconductor layer 34 can be, e.g., silicon (Si) layers. Thus, the silicon layers 26 and 34 are separated from each other by SiGe layers 28, 30, 32, where SiGe layers 28, 32 have a germanium content of about 35% and SiGe layer 30 has a germanium content of about 65%. The fin stack 20 is mechanically stable because it is "fat" or wider than conventional fin stacks.

Structure 100 is a cross-sectional view taken along axis "X" of view 140. Axis "X" is perpendicular to the fin stack 20.

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline.

The hardmask layer 40 can be a nitride, for example, a silicon nitride (SiN), an oxynitride, for example, silicon oxynitride (SiON), or a combination thereof. In a preferred embodiment, the hardmask layer 40 can be silicon nitride (SiN), for example, $Si_3N_4$.

The ILD 42 can include any materials known in the art, such as, for example, porous silicates, carbon doped oxides, silicon dioxides, silicon nitrides, silicon oxynitrides, or other dielectric materials. The ILD 42 can be formed using any method known in the art, such as, for example, chemical vapor deposition, plasma enhanced chemical vapor deposition, atomic layer deposition, or physical vapor deposition.

FIG. 2 is a cross-sectional view of the fin stack of FIG. 1 where hardmask 40 is firstly removed selectively to the ILD 42 to form a top opening 50, and after that, a conformal liner is deposited followed by anisotropic etch to form inner spacers, in accordance with an embodiment of the present invention.

After that, using the inner spacer as the hardmask, the CFET stack is etched to form a recess opening 50 all the way to expose bottom stack 22. The structure 110 remains stable because of the support of the ILD 42.

Structure 110 is a cross-sectional view taken along axis "X" of view 140. Axis "X" is perpendicular to the fin stack 20.

FIG. 3 is a cross-sectional view of the fin stack of FIG. 2 where overfill and chemical-mechanical polishing (CMP) take place, in accordance with an embodiment of the present invention.

In various example embodiments, a sacrificial material 52 is deposited within the recess or opening 50. The sacrificial material 52 can be, e.g., SiGe. The sacrificial material 52 can have a germanium content of about 35%. Thus, the sacrificial material 52 can be the same material as the second semiconductor layer 24, the fourth semiconductor layer 28 and the sixth semiconductor layer 32. The sacrificial material 52 can be polished by, e.g., CMP to be flush with a top surface of the ILD 42.

Structure 120 is a cross-sectional view taken along axis "X" of view 140. Axis "X" is perpendicular to the fin stack 20.

FIG. 4 is a cross-sectional view of the fin stack of FIG. 3 where etching reveals the fin structure, in accordance with an embodiment of the present invention.

In various example embodiments, the sacrificial material 52 is recessed and the top inner spacer is removed. The ILD 42 is recessed such that ILD portions 42' remain adjacent the substrate 10. The fin stack 60 is revealed. In other words, the sidewalls of the fin stack 60 are exposed. The fin stack 60 is still mechanically stable because it is "fat" or wider than conventional fin stacks.

Structure 130 is a cross-sectional view taken along axis "X" of view 140. Axis "X" is perpendicular to the fin stack 20.

FIG. 5 is a cross-sectional view of the fin stack of FIG. 4 where sacrificial gates are patterned, in accordance with an embodiment of the present invention.

In various example embodiments, a sacrificial layer 70 and a sacrificial cap 72 are deposited. The leftmost view is a cross-sectional view taken along axis "X" of view 140, the center view is a cross-sectional view taken along axis "Z" of view 140, and the rightmost view is a cross-sectional view taken along axis "Y" of view 140. The sacrificial layer 70 and the sacrificial cap 72 are shown in views "X" and "Y." The sacrificial layer 70 can also be referred to as a dummy gate. The sacrificial layer 70 can include, e.g., amorphous silicon or polysilicon. The sacrificial layer 70 can then be planarized to form a planar surface. The sacrificial cap 72 can be, e.g., a nitride cap.

FIG. 6 is a cross-sectional view of the fin stack of FIG. 5 where sacrificial layers are selectively removed, in accordance with an embodiment of the present invention.

In various example embodiments, the first sacrificial layer 22 and the fifth semiconductor layer 30 are selectively removed. These are the SiGe layers 22, 30 having a germanium content of about 65%. The selective removal of the first and fifth sacrificial layers 22, 30 results in openings or gaps 74. Gaps 74 are depicted in the "X" view, the "Z" view, and the "Y" view. The "X" view is the leftmost view, the "Z" view is the center view, and the "Y" view is the rightmost view.

The SiGe layers 22, 30 can be removed by using, for example, hydrochloric acid (HCl) gas etch, or wet etches, such as, for example, hydrogen peroxide ($H_2O_2$), especially at higher SiGe concentrations, or SC1 clean (1:1:5 solution of $NH_4OH$ (ammonium hydroxide)+$H_2O_2$ (hydrogen peroxide)+$H_2O$ (water)). In another example embodiment, the etching can be performed by, e.g., wet etch techniques. The selective wet etch process can include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

FIG. 7 is a cross-sectional view of the fin stack of FIG. 6 where spacers are formed, in accordance with an embodiment of the present invention.

In various example embodiments, spacers 76 are formed or deposited within the gaps 74. The spacers 76 can include an insulating material, for example, silicon dioxide, silicon nitride, SiOCN, or SiBCN. The spacer material can be deposited by a deposition process, for example, CVD or PVD.

In the leftmost view "X," the spacers 76 are formed adjacent the second semiconductor layer 24 and adjacent the fourth and sixth semiconductor layers 28, 32, thus filling the gaps 74.

In the center view "Z," the spacer 76 covers the entirety of the fin stack.

In the rightmost view "Y," the spacer 76 is formed adjacent the fourth and sixth semiconductor layers 28, 32, as well as on opposed ends of the sacrificial layer 70 and the sacrificial cap 72.

Figure 8:
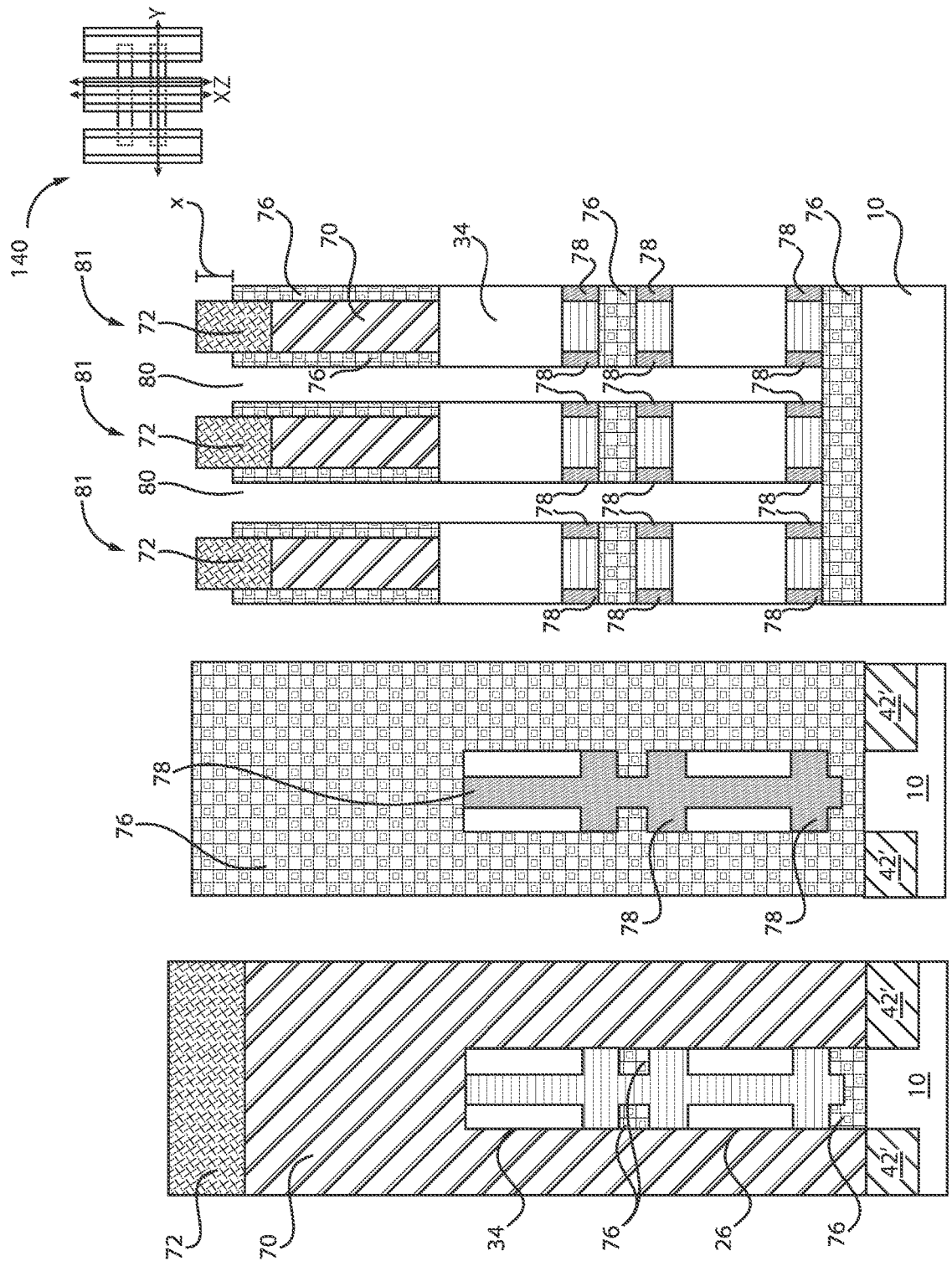
FIG. 8 is a cross-sectional view of the fin stack of FIG. 7 depicting a fin recess and inner spacer formation, in accordance with an embodiment of the present invention.

FIG. 8 is a cross-sectional view of the fin stack of FIG. 7 depicting a fin recess and inner spacer formation, in accordance with an embodiment of the present invention.

In various example embodiments, the fin stack is recessed and inner spacers 78 are formed. The "fat" fin structure or wide fin structure is split into channel fins 81. The multiple channel fins 81 provide for mechanical stability of the structure and avoid possible fin collapse.

The leftmost view "X" remains the same as in FIG. 7.

In the center view "Z," the inner spacer 78 is shown covering the sacrificial material 52.

In the rightmost view "Y," the inner spacers 78 are shown on opposed ends of the second, fourth, and sixth sacrificial layers 24, 28, 32, which are SiGe layers with a germanium content of about 35%. Moreover, openings 80 are formed between the channel fins 81 due to the recess. The fin recess also results in spacers 76 being recessed by a distance "x" along the sacrificial cap 72. Thus, a portion of sidewalls of the sacrificial cap 72 is also exposed.

Figure 9:
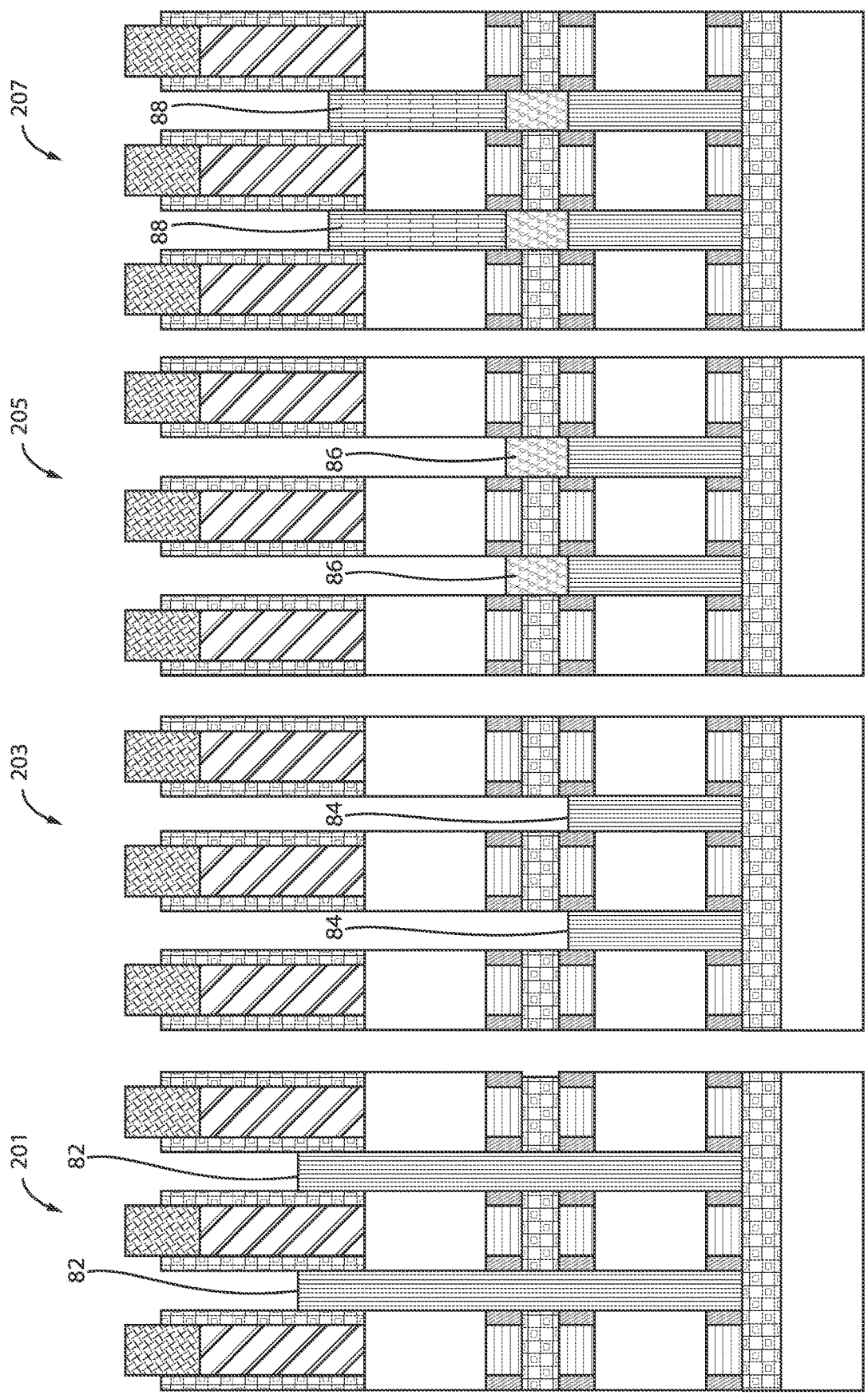
FIG. 9 is a cross-sectional view of the fin stack of FIG. 8 where a first type of epitaxy is grown, the first type of epitaxy is recessed and patterned, a dielectric region is formed over the recessed first type of epitaxy, and a second type of epitaxy is grown, in accordance with an embodiment of the present invention.

FIG. 9 is a cross-sectional view of the fin stack of FIG. 8 where a first type of epitaxy is grown, the first type of epitaxy is recessed and patterned, a dielectric region is formed over the recessed first type of epitaxy, and a second type of epitaxy is grown, in accordance with an embodiment of the present invention.

In various example embodiments, a first type of epitaxy 82 is grown between the fin segments 81. This is shown in structure 201. The first type of epitaxy 82 directly contacts sidewalls of the inner spacers 78 and sidewalls of the third semiconductor layer 26 and the seventh semiconductor layer 34, which are the Si semiconductor layers. The first type of epitaxy 82 can be, e.g., a PFET epitaxy.

In structure 203, the first type of epitaxy is recessed and patterned to form remaining first type epitaxy 84. The remaining first type epitaxy 84 directly contacts sidewalls of the third semiconductor layer 26 and inner spacers 78 adjacent the second semiconductor layer 24 and the fourth semiconductor layer 28.

In structure 205, a dielectric layer 86 is formed over and in direct contact with the remaining first type epitaxy 84. The dielectric layer 86 can assist in separating the remaining first type epitaxy 84 from the second type of epitaxy 88 in structure 207.

In structure 207, a second type of epitaxy 88 is formed over and in direct contact with the dielectric layer 86. The second type of epitaxy 88 can be, e.g., an NFET epitaxy. The second type of epitaxy 88 directly contacts sidewalls of the seventh semiconductor layer 34, which is a Si layer.

A length of the first type epitaxy 84 can be substantially equal to a length of the second type epitaxy 88. The length of the dielectric layer 86 can be less than a length of the first type epitaxy 84 and the second type epitaxy 88. The first type epitaxy 84 and the second type epitaxy 88 are configured to separate the channel fins 81.

The dielectric layer 86 can have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H. The dielectric layer 86 can also be, e.g., $HfO_2$, $ZrO_2$, $Dy_2O_3$, SiON, $Al_2O_3$, and a high-k dielectric.

The dielectric layer 86 can be formed by either directional deposition, such as gas cluster ion beam (GCIB) or high density plasma (HDP), or over-fill and recess.

Generally, epitaxial growth, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor material with sufficient energy to move around on the surface and orient themselves to the crystal arrangement of the atoms of the deposition surface. Therefore, an epitaxial material has the same crystalline characteristics as the deposition surface on which it is formed. For example, an epitaxial material deposited on a <100> crystal surface will take on a <100> orientation.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and can be conducted at higher or lower temperatures as needed.

Figure 10:
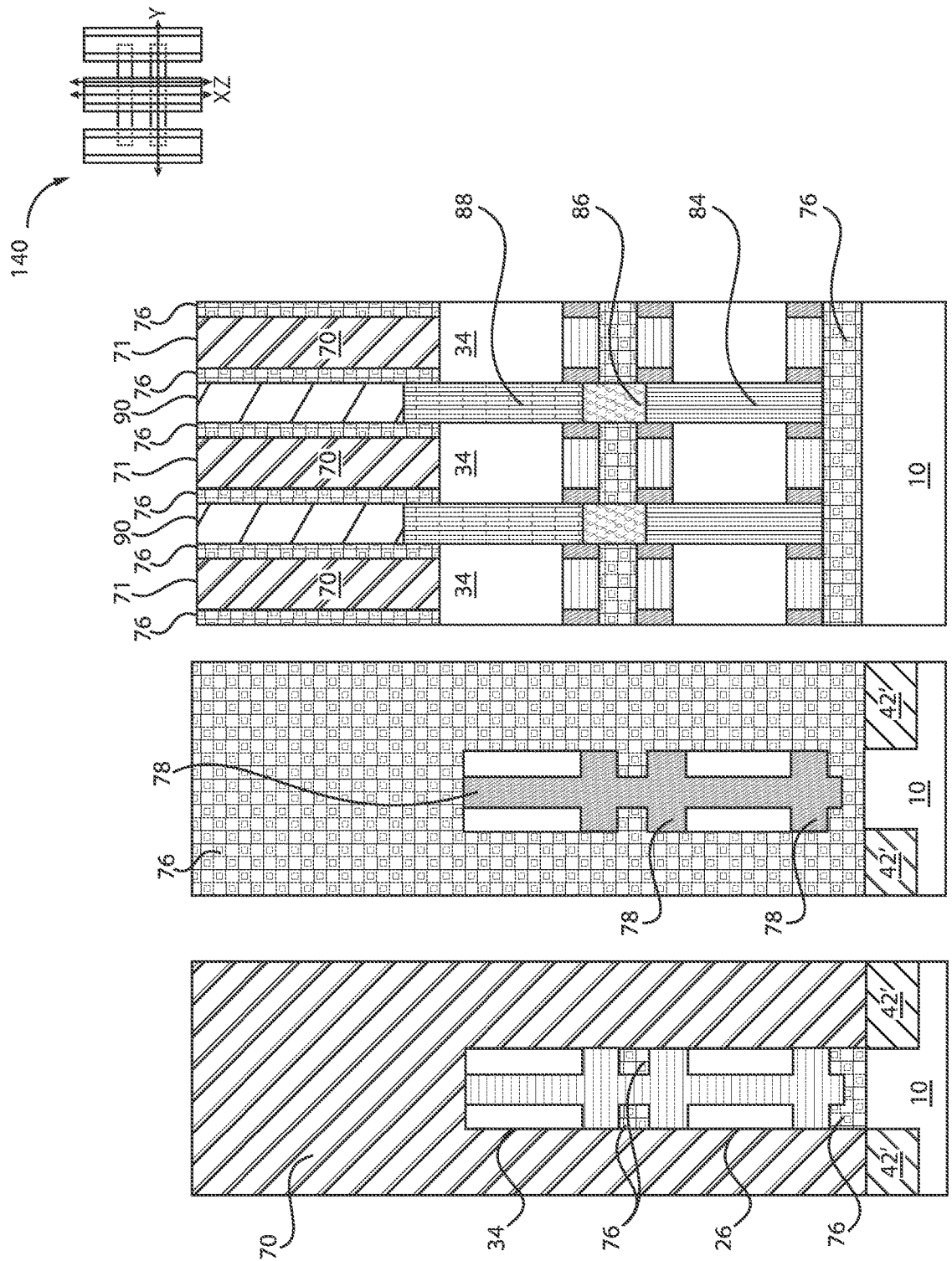
FIG. 10 is a cross-sectional view of the fin stack of FIG. 9 depicting interlayer dielectric (ILD) deposition, in accordance with an embodiment of the present invention.

FIG. 10 is a cross-sectional view of the fin stack of FIG. 9 depicting interlayer dielectric (ILD) deposition, in accordance with an embodiment of the present invention.

In various example embodiments, an ILD 90 is deposited over the second type epitaxy 88. The ILD 90 is shown in the rightmost view "Y." Additionally, the sacrificial cap 72 is removed to expose a top surface 71 of the sacrificial layer 70.

Figure 11:
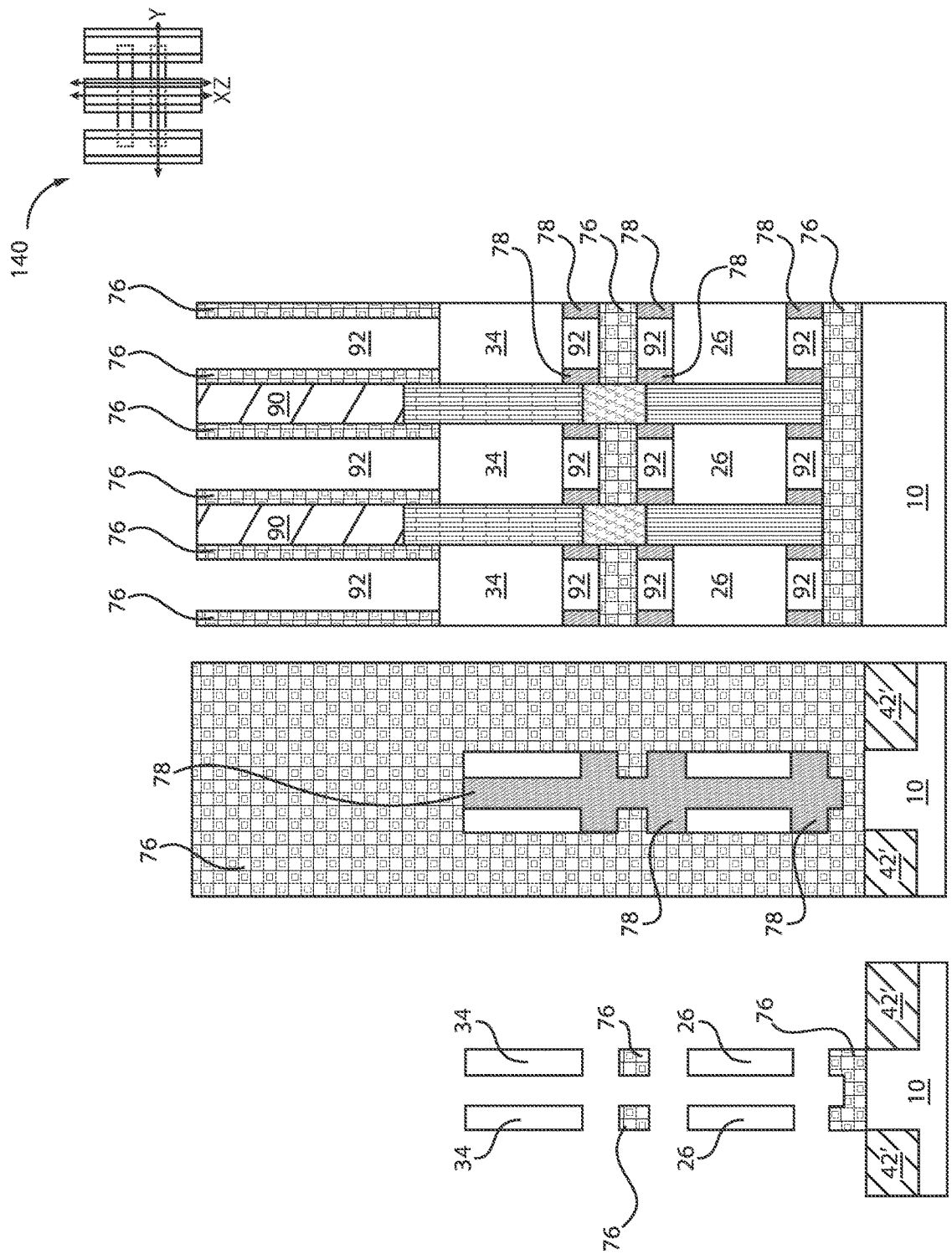
FIG. 11 is a cross-sectional view of the fin stack of FIG. 10 depicting selective removal of sacrificial layers, in accordance with an embodiment of the present invention.

FIG. 11 is a cross-sectional view of the fin stack of FIG. 10 depicting selective removal of sacrificial layers, in accordance with an embodiment of the present invention.

In various example embodiments, the sacrificial material 70 is removed and the sacrificial layers 24, 28, 32 are also removed, that being the SiGe layers having a germanium content of about 35%. The removal of such sacrificial materials and layers results in the formation of a plurality of gaps 92 (rightmost view "Y"). A first set of the plurality of gaps 92 are horizontally aligned with the first type epitaxy 84 and a second set of the plurality of gaps 92 are horizontally aligned with the second type epitaxy 88 along axis "B" (see FIG. 14).

In the leftmost view "X," the third and seventh semiconductor layers 26, 34 remain, as well as the spacers 76.

Center view "Z" remains the same as in FIG. 10.

In the rightmost view "Y," the plurality of gaps 92 are present between spacer 76 and the third semiconductor layer 26. The plurality of gaps 92 are further present between spacer 76 and the seventh semiconductor layer 34.

The dummy gate removal is part of replacement metal gate (RMG) process. However, the present principles are applicable to gate-first processes where metal gates are formed instead of dummy gates. The gate pull process removes the dummy gate material (e.g., polysilicon) selective to the layers 26, 34. The removal of the dummy gates forms openings or gaps 92.

Figure 12:
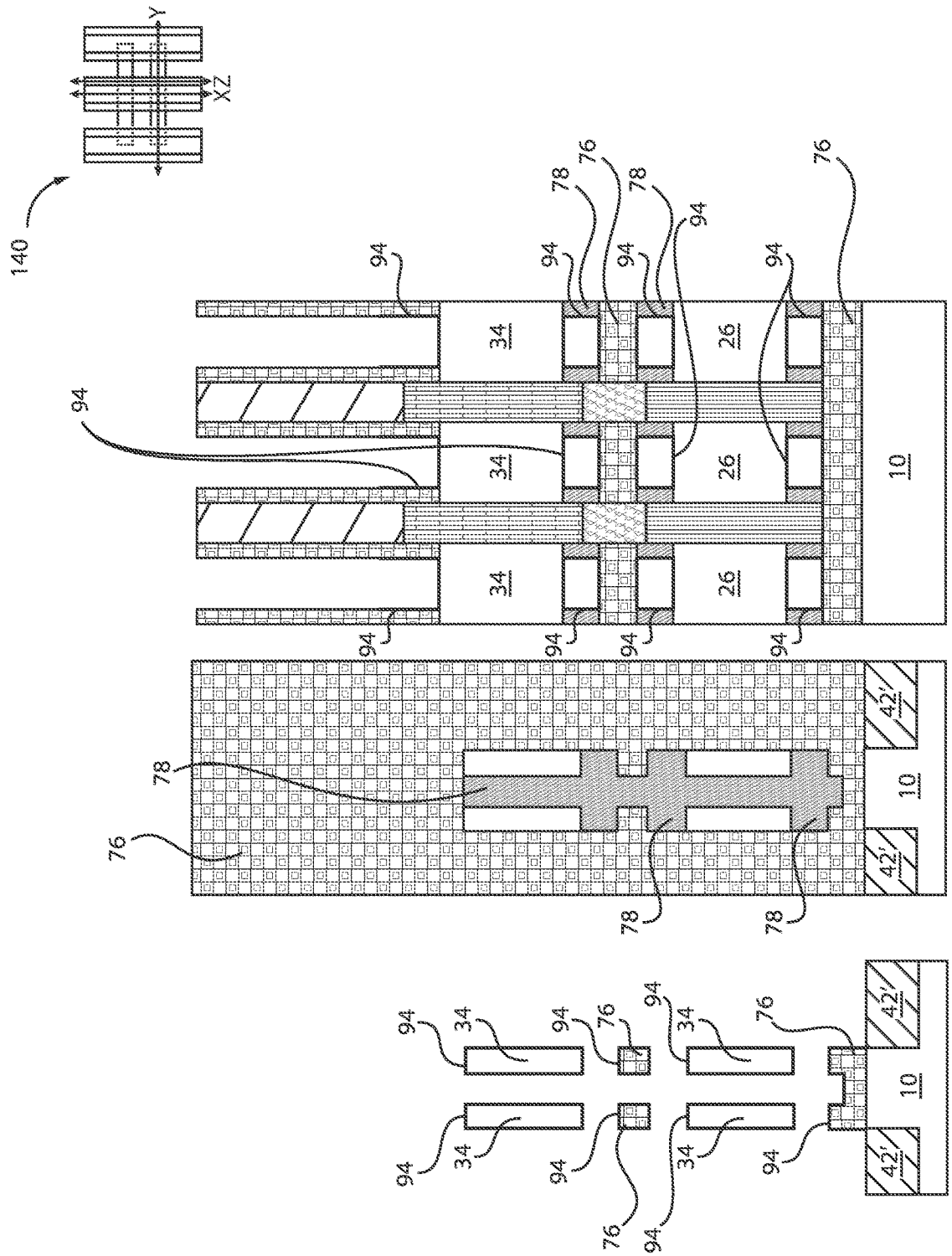
FIG. 12 is a cross-sectional view of the fin stack of FIG. 11 depicting high-k (HK) deposition, in accordance with an embodiment of the present invention.

FIG. 12 is a cross-sectional view of the fin stack of FIG. 11 depicting high-k (HK) dielectric deposition, in accordance with an embodiment of the present invention.

In various example embodiments, a high-k (HK) dielectric 94 is deposited adjacent the plurality of gaps 92.

The HK dielectric 94 can include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

Figure 13:
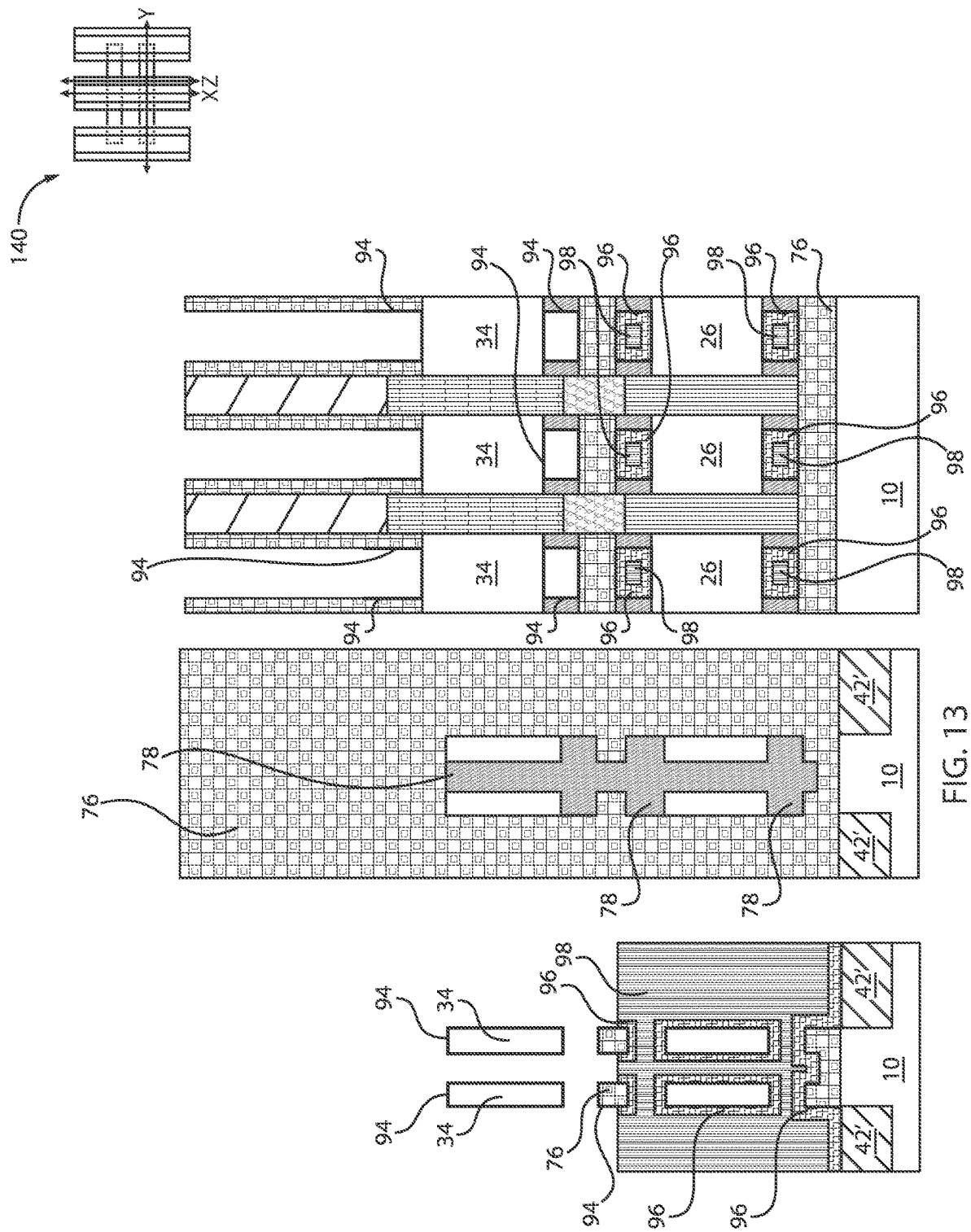
FIG. 13 is a cross-sectional view of the fin stack of FIG. 12 depicting first work function metal (WFM) deposition and chamfering, in accordance with an embodiment of the present invention.

FIG. 13 is a cross-sectional view of the fin stack of FIG. 12 depicting first work function metal (WFM) deposition and chamfering, in accordance with an embodiment of the present invention.

In various example embodiments, a first WFM 96 is deposited followed by OPL 98.

The first work-function metal (WFM) layer 96, can include, but is not limited to, for a pFET, titanium nitride (TiN), tantalum nitride (TaN) or ruthenium (Ru).

Therefore, a first set of the plurality of gaps 92 are filled with a p-type work function metal (WFM) 96 to form a p-type field effect transistor (pFET) structure.

The OPL 98 can be formed at a predetermined thickness to provide reflectivity and topography control during etching of the hard mask layers below. The OPL 98 can include an organic material, such as a polymer. The thickness of the OPL 98 can be in a range from about 50 nm to about 300 nm.

In the rightmost view "Y," the first WFM 96 can be formed in the plurality of gaps 92 on opposed ends of the third semiconductor layer 26. The first WFM 96 is formed directly adjacent the HK dielectric 94.

Figure 14:
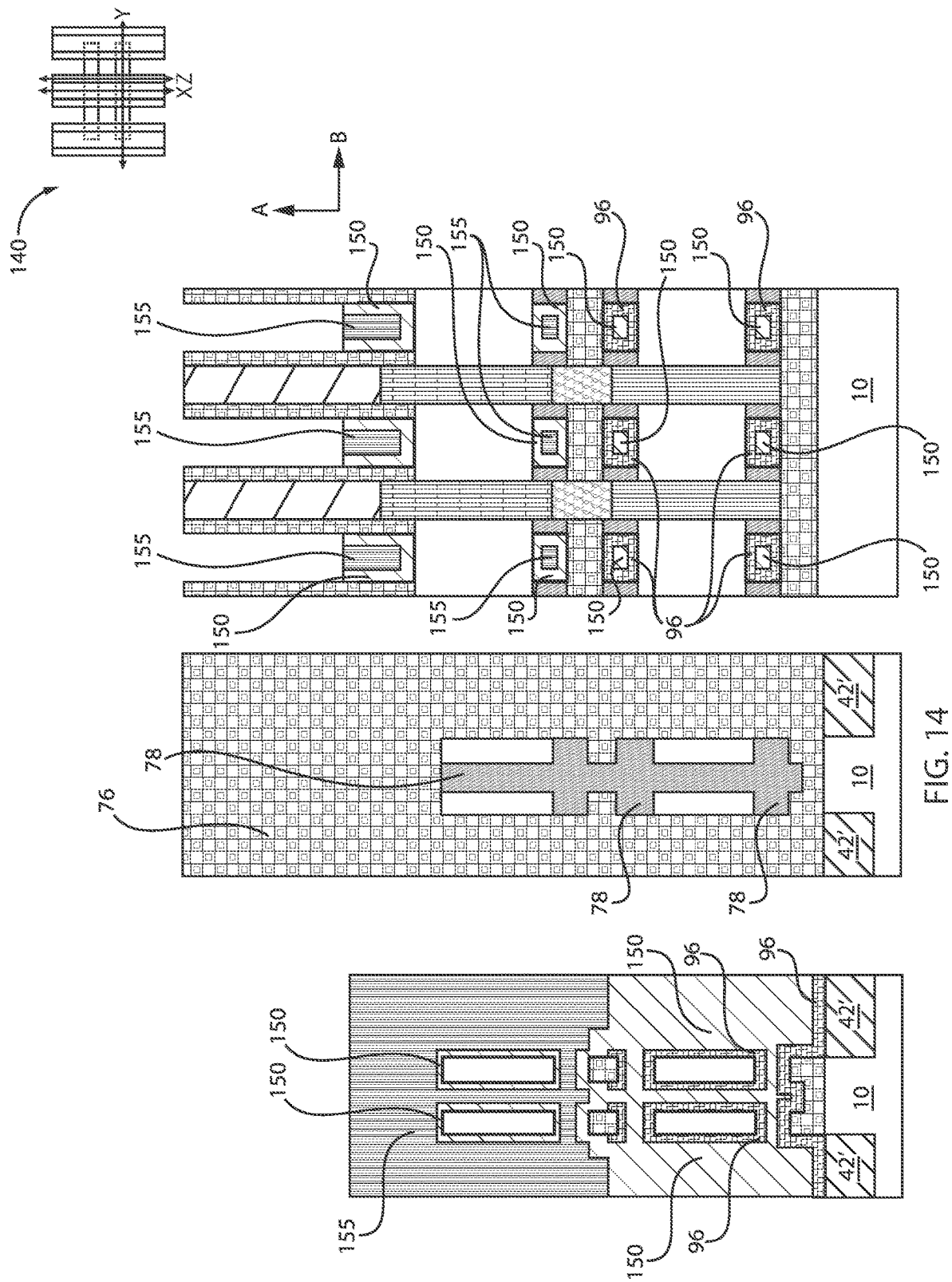
FIG. 14 is a cross-sectional view of the fin stack of FIG. 13 depicting second work function metal (WFM) deposition and chamfering, in accordance with an embodiment of the present invention.

FIG. 14 is a cross-sectional view of the fin stack of FIG. 13 depicting second work function metal (WFM) deposition and chamfering, in accordance with an embodiment of the present invention.

In various example embodiments, a second WFM layer 150 is deposited followed by OPL 155. The second work-function metal (WFM) layer 150, can include, but is not limited to, for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN.

Therefore, a second set of the plurality of gaps 92 are filled with an n-type WFM 150 to form an n-type field effect transistor (nFET) structure, where the nFET structure is stacked over the pFET structure. The p-type WFM 96 is vertically aligned with the n-type WFM 150. Vertical alignment can be along axis "A."

In the leftmost view "X," the second WFM layer 150 is formed adjacent the first WFM layer 96. The second WFM layer 150 is also formed around the HK dielectric 94 formed surrounding the seventh semiconductor layer 34.

Figure 15:
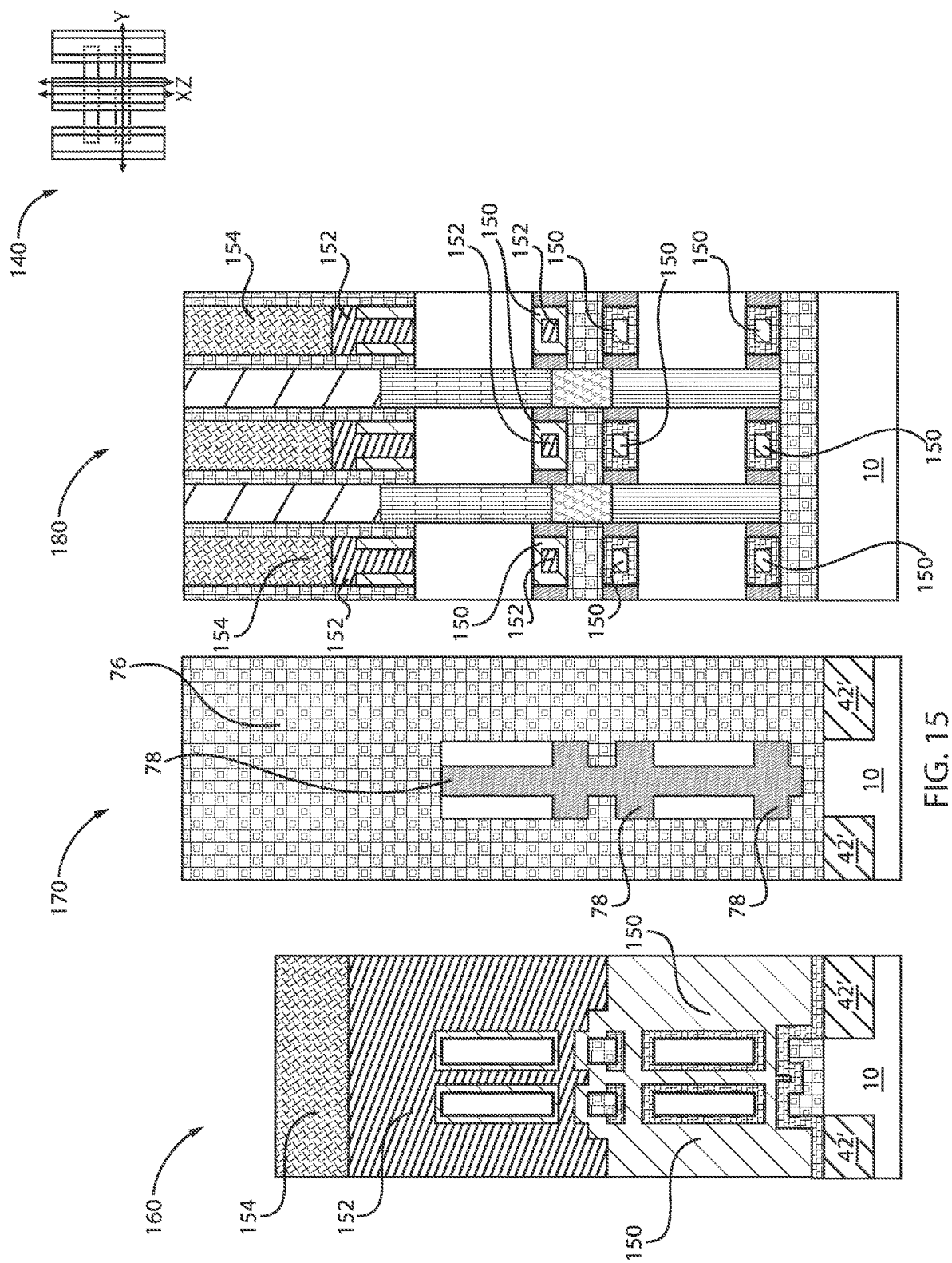
FIG. 15 is a cross-sectional view of the fin stack of FIG. 14 where a replacement metal gate is formed, in accordance with an embodiment of the present invention.

FIG. 15 is a cross-sectional view of the fin stack of FIG. 14 where a replacement metal gate is formed, in accordance with an embodiment of the present invention.

In various example embodiments, a metal fill 152 takes place. The metal fill 152 can be, e.g., tungsten (W) or cobalt (Co) with silicide metal liner such as titanium (Ti) and titanium nitride (TiN). The conductive metal 152 can be deposited by a suitable deposition process, for example, CVD, PECVD, PVD, plating, thermal or e-beam evaporation, and sputtering. A planarization process, for example, CMP, is performed to polish the surface of the conductive metal 152. A sacrificial cap 154 can then be deposited over the metal fill 152.

The final structure in the "X" view (leftmost) is designated as 160, the final structure in the "Z" view (center) is designated as 170, and the final structure in the "Y" view (rightmost) is designated as 180. As a result, the structures 160, 170, 180 prevent fin collapsing by forming a wide fin including multiple channel fins (each includes two fins vertically overlapped). The stacked FinFET structure is thus created where PFETs (NFETs) are positioned directly on top of NFETs (PFETs). Each NFET (and each PFET) has a high-k dielectric and a work function metal (WFM) wrapped around the channel. A dielectric material is positioned in between NFET and PFET channels but does not come in direct contact with the channels. Also, the NFET source/drain (S/D) and the PFET source/drain (S/D) are isolated from each other by dielectrics.

The inner spacer 78 constructed adjacent the channel fins has a unique shape. The inner spacer 78 defines a vertical section extending from an upper portion to a lower portion of the channel fins, first and second horizontal sections defined at the upper portion of the channel fins, and a third horizontal section defined at the lower portion of the channel fins. In other words, a vertical section (with respect to axis "A") extends through a middle portion of the three horizontal sections (with respect to axis "B"). The vertical section extends from the top of the upper fin to the bottom of the dielectric isolation region.

Regarding FIGS. 1-15, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Non-limiting examples of dielectrics include silicon nitride, SiOCN, SiBCN, or a combination thereof. One directional deposition method that can be used to deposit silicon nitride, for example, is gas cluster ion beam (GCIB) deposition.

Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for making a mechanically stable complementary field effect transistor (CFET) without fin collapse (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing mechanically stable fins, the method comprising:
   forming a fin stack including a plurality of sacrificial layers;
   recessing the fin stack to form channel fins;
   depositing a first type epitaxy between the channel fins;
   depositing a dielectric region over the first type epitaxy;
   depositing a second type epitaxy over the dielectric region;
   removing the plurality of sacrificial layers resulting in formation of a plurality of gaps;
   filling a first set of the plurality of gaps with a p-type work function metal (WFM) to form a p-type field effect transistor (pFET) structure; and
   filling a second set of the plurality of gaps with an n-type WFM to form an n-type field effect transistor (nFET) structure, where the nFET structure is stacked over the pFET structure.

2. The method of claim 1, wherein the p-type WFM is vertically aligned with the n-type WFM.

3. The method of claim 1, wherein the first set of the plurality of gaps are horizontally aligned with the first type epitaxy and the second set of the plurality of gaps are horizontally aligned with the second type epitaxy.

4. The method of claim 1, wherein a length of the first type epitaxy is substantially equal to a length of the second type epitaxy.

5. The method of claim 1, wherein a metal fill is performed for the n-type WFM.

6. The method of claim 1, wherein a high-k (HK) material is deposited adjacent the plurality of gaps before the p-type WFM and n-type WFM fills.

7. A method for constructing mechanically stable fins, the method comprising:
   forming a fin stack including a plurality of sacrificial layers;

etching an opening within the fin stack to define inner spacers;
filling the opening with a sacrificial material;
depositing a dummy gate;
selectively removing a first set of the plurality of sacrificial layers of the fin stack resulting in formation of a plurality of first gaps;
filling the plurality of first gaps with a spacer material;
recessing the fin stack to form channel fins;
depositing a first type epitaxy between the channel fins;
depositing a dielectric region over the first type epitaxy;
depositing a second type epitaxy over the dielectric region;
removing the dummy gate and a second set of the plurality of sacrificial layers resulting in formation of a plurality of second gaps;
filling a first set of the plurality of second gaps with a first work function metal (WFM); and
filling a second set of the plurality of second gaps with a second WFM.

8. The method of claim 7, wherein the first WFM is a p-type WFM and the second WFM is an n-type WFM.

9. The method of claim 8, wherein the p-type WFM is vertically aligned with the n-type WFM.

10. The method of claim 8, wherein the p-type WFM is stacked over the n-type WFM.

11. The method of claim 7, wherein the first set of the plurality of second gaps are horizontally aligned with the first type epitaxy and the second set of the plurality of second gaps are horizontally aligned with the second type epitaxy.

12. The method of claim 7, wherein a length of the first type epitaxy is substantially equal to a length of the second type epitaxy.

13. The method of claim 7, wherein a metal fill is performed for the second WFM.

14. The method of claim 7, wherein a high-k (HK) material is deposited adjacent the plurality of second gaps before the first and second WFM fills.

15. A semiconductor structure for constructing mechanically stable fins, the semiconductor structure comprising:
channel fins disposed over a substrate;
an inner spacer constructed adjacent the channel fins, the inner spacer defining a vertical section extending from an upper portion to a lower portion of the channel fins, first and second horizontal sections defined at the upper portion of the channel fins, and a third horizontal section defined at the lower portion of the channel fins, wherein the first, second, and third horizontal sections extend through the vertical section;
a first type epitaxy disposed between the channel fins;
a dielectric region disposed over the first type epitaxy; and
a second type epitaxy disposed over the dielectric region.

16. The semiconductor structure of claim 15, wherein:
a plurality of gaps are defined within the channel fins; and
a p-type work function metal (WFM) is filled within a first set of the plurality of gaps to make a p-type field effect transistor (pFET) structure.

17. The semiconductor structure of claim 16, wherein:
an n-type WFM is filled within a second set of the plurality of gaps to make an n-type field effect transistor (nFET) structure, where the nFET structure is stacked over the pFET structure.

18. The semiconductor structure of claim 17, wherein the p-type WFM is vertically aligned with the n-type WFM.

19. The semiconductor structure of claim 18, wherein the first set of the plurality of gaps are horizontally aligned with the first type epitaxy and the second set of the plurality of gaps are horizontally aligned with the second type epitaxy.

* * * * *